United States Patent
Mantani et al.

(10) Patent No.: US 10,449,641 B2
(45) Date of Patent: *Oct. 22, 2019

(54) SYSTEM FOR MANUFACTURING ASSEMBLY BOARD AND METHOD FOR INSTALLING UNDERSUPPORTING DEVICE OF THE SYSTEM

(71) Applicant: PANASONIC INTELLECTUAL PROPERTY MANAGEMENT CO., LTD., Osaka (JP)

(72) Inventors: Masayuki Mantani, Yamanashi (JP); Takaaki Sakaue, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 107 days.

This patent is subject to a terminal disclaimer.

(21) Appl. No.: 15/375,678

(22) Filed: Dec. 12, 2016

(65) Prior Publication Data

US 2017/0239764 A1  Aug. 24, 2017

(30) Foreign Application Priority Data

Feb. 18, 2016 (JP) .................................. 2016-028462
Feb. 18, 2016 (JP) .................................. 2016-028463

(51) Int. Cl.
  *B23P 19/04* (2006.01)
  *B41F 15/18* (2006.01)
  (Continued)

(52) U.S. Cl.
  CPC ............ *B23P 19/04* (2013.01); *B25B 11/002* (2013.01); *B25B 11/005* (2013.01);
  (Continued)

(58) Field of Classification Search
  CPC ... H05K 2203/0147; H05K 2203/0152; H05K 2203/0165; H05K 2203/0173;
  (Continued)

(56) References Cited

U.S. PATENT DOCUMENTS

2013/0020379 A1\* 1/2013 Kim ..................... H05K 3/1233
                                                          228/256
2015/0075721 A1   3/2015 Mantani et al.
(Continued)

FOREIGN PATENT DOCUMENTS

JP      H03-289198 A    12/1991
JP      2000-124690 A    4/2000
(Continued)

*Primary Examiner* — Matthew P Travers
(74) *Attorney, Agent, or Firm* — Pearne & Gordon LLP

(57) ABSTRACT

A system for manufacturing an assembly board includes an undersupporting device, a carrier configured to hold the undersupporting device, a transporter, an undersupporting-device installer attachable to and detachable from the undersupporting device, a board processor, and a magnet provided on a lower surface of the undersupporting device. The transporter transports the undersupporting device to a working position by transporting the carrier to the working position while the carrier holds the undersupporting device on the lower surface of the carrier. The transported undersupporting device is fixed to the undersupporting-device installer by a magnetic force of the magnet at the working position. The transporter transports the board to the working position. The undersupporting device supports the lower surface of the board when the board is transported to the working position. The board processor performs a predetermined processing to an upper surface of the board.

10 Claims, 17 Drawing Sheets

(51) Int. Cl.
 *B25B 11/00* (2006.01)
 *H05K 13/00* (2006.01)
 *B41F 15/08* (2006.01)
 *B41F 15/26* (2006.01)
 *H05K 3/12* (2006.01)

(52) U.S. Cl.
 CPC .......... *B41F 15/0881* (2013.01); *B41F 15/18* (2013.01); *B41F 15/26* (2013.01); *H05K 13/0069* (2013.01); *B65G 2201/0261* (2013.01); *H05K 3/1216* (2013.01); *H05K 2203/0165* (2013.01)

(58) Field of Classification Search
 CPC ....... H05K 2203/1509; H05K 13/0069; H05K 13/046; H05K 13/0469; H05K 3/1216; H05K 13/04; H05K 13/0465; H05K 3/30–3/301; B41F 15/0818; B41F 15/0881; B41F 15/18; B41F 15/26; Y10T 29/5337; Y10T 29/53365; Y10T 29/53313; Y10T 29/49829; Y10T 29/53265; Y10T 29/53191; Y10T 29/53196; Y10T 29/53539–29/53548; Y10T 29/49002; Y10T 29/49885; Y10T 29/49998; Y10T 29/53174–29/53183; B23P 21/004; B23P 19/04; B25B 11/002; B25B 11/005
 See application file for complete search history.

(56) References Cited

U.S. PATENT DOCUMENTS

| | | |
|---|---|---|
| 2015/0321464 A1 | 11/2015 | Horie et al. |
| 2015/0321465 A1 | 11/2015 | Horie et al. |
| 2016/0007512 A1* | 1/2016 | Higashi ............. H05K 13/0061 29/832 |

FOREIGN PATENT DOCUMENTS

| | | | |
|---|---|---|---|
| JP | 2008166583 A * | 7/2008 | ............. H05K 13/04 |
| JP | 2015-083364 A | 4/2015 | |
| JP | 2015-214088 A | 12/2015 | |
| JP | 2015-214089 A | 12/2015 | |

* cited by examiner

SYSTEM FOR MANUFACTURING ASSEMBLY BOARD AND METHOD FOR INSTALLING UNDERSUPPORTING DEVICE OF THE SYSTEM

BACKGROUND

1. Technical Field

The present disclosure relates to an assembly board manufacturing system which performs predetermined processing, such as screen printing or mounting components with respect to a board, and an installation method of an undersupporting device in the assembly board manufacturing system.

2. Description of the Related Art

In the related art, in an assembly board manufacturing system which manufactures assembly boards by performing predetermined processing, such as screen printing or mounting components with respect to a board, in order to stably perform the processing with respect to the board, a lower surface of the board which becomes a processing target is supported (for example, Japanese Patent Unexamined Publication No. 2015-214088).

An undersupporting device which is used in supporting the board has a shape or a size that varies in accordance with the size of the board or a state (for example, a disposition state of components which have already been mounted on the lower surface of the board) of the lower surface, and when changing the type of the board to be produced, preparatory work of exchanging the undersupporting device in accordance with the board that becomes the processing target is required.

SUMMARY

A system for manufacturing an assembly board includes an undersupporting device, a carrier configured to hold the undersupporting device, a transporter configured to transport a board and the carrier, an undersupporting-device installer provided below the transporter and being attachable to and detachable from the undersupporting device, a board processor configured to perform a predetermined processing to an upper surface of the board, and a magnet provided on a lower surface of the undersupporting device. The transporter transports the undersupporting device to a working position by transporting the carrier to the working position while the carrier holds the undersupporting device on the lower surface of the carrier. The transported undersupporting device is fixed to the undersupporting-device installer by a magnetic force of the magnet at the working position. The transporter transports the board to the working position. The undersupporting device supports the lower surface of the board when the board is transported to the working position. The board processor performs the predetermined processing to the upper surface of the board while the undersupporting device is fixed to the undersupporting-device installer and the undersupporting device supports the lower surface of the board.

In the assembly board manufacturing system, it is possible to reduce the number of work processings required for exchanging the undersupporting device, and to improve the productivity of the assembly boards.

DETAILED DESCRIPTION

In a system disclosed in Japanese Patent Unexamined Publication No. 2015-214088, most of the preparatory work of exchanging the undersupporting device is performed manually, and there is a concern that the number of work processings increases and the productivity of the assembly board deteriorates.

Figure 1:
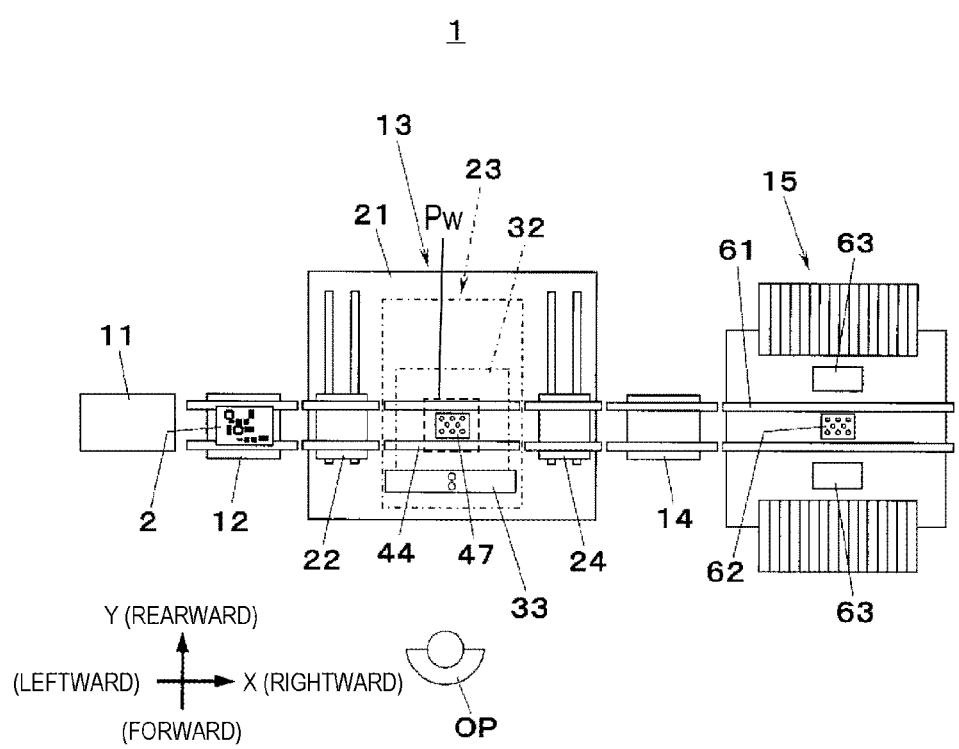
FIG. 1 is a plan view illustrating a schematic configuration of an assembly board manufacturing system in an embodiment.

Hereinafter, an embodiment of this disclosure will be described with reference to the drawings. FIG. 1 illustrates assembly board manufacturing system 1 in the embodiment. Assembly board manufacturing system 1 performs screen printing processing and mounting processing of a component with respect to board 2, manufactures an assembly board, and includes board supplier 11, carry-in side relay conveyor 12, screen printing device 13, carry-out side relay conveyor 14, and component placement device 15. A flow of board 2 is in the direction from a left side to a right side when viewed from operator OP, and the direction is the X-axis direction. In addition, the forward-and-rearward direction when viewed from operator OP is considered as the Y-axis direction, and the upward-and-downward direction is considered as the Z-axis direction.

Board supplier 11 is provided on the most upstream process side of assembly board manufacturing system 1, and continuously supplies board 2. Carry-in side relay conveyor 12 is provided on a downstream process side of board supplier 11, receives board 2 supplied by board supplier 11, and delivers board 2 to screen printing device 13.

As illustrated in FIG. 1, screen printing device 13 is provided with carry-in part 22, printing performer 23, and carry-out part 24 on base 21. Printing performer 23 is provided at the center of base 21, and carry-in part 22 is provided in a region (upstream process side of printing performer 23) on a left side of printing performer 23 on base 21. Carry-out part 24 is provided in a region (downstream process side of printing performer 23) on a right side of printing performer 23 on base 21.

Figure 2:
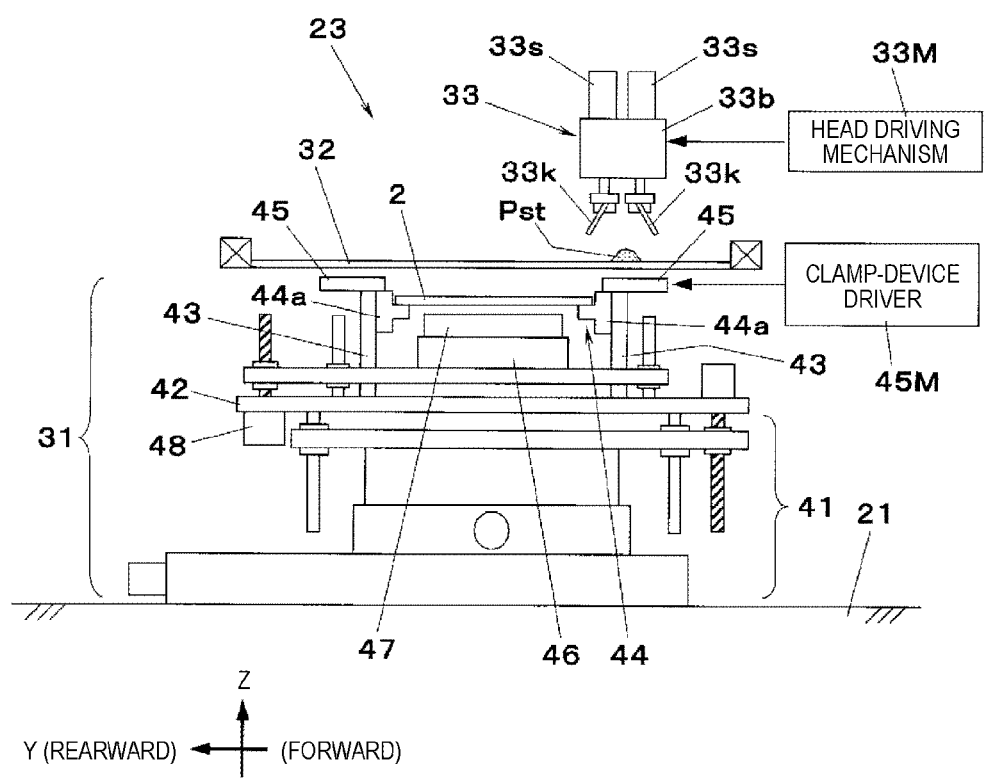
FIG. 2 is a side view of a screen printing device provided in the assembly board manufacturing system in the embodiment.

In FIG. 2, printing performer 23 is provided with board holding unit 31 provided on base 21, mask 32, and squeegee head 33. Board holding unit 31 is provided with XYZ rotation stage 41 provided on base 21; base part 42 which freely moves on a horizontal plane by XYZ rotation stage 41, moves to be raised and lowered, and rotates around the Z-axis; transporter 44 and one pair of clamp devices 45 which are attached to one pair of transporter support walls 43 provided in base part 42; undersupporting-device installer 46 which is provided below transporter 44; undersupporting device 47 which is installed to be freely attached to and detached from an upper surface of undersupporting-device installer 46; and an elevator mechanism 48 (undersupporting-device installer elevator mechanism) which raises and lowers undersupporting-device installer 46 (that is, undersupporting device 47) with respect to base part 42. Mask 32 and squeegee head 33 configure a board processor which performs predetermined processing to the upper surface of board 2 of which the lower surface is supported by undersupporting device 47.

In FIG. 2, transporter 44 includes one pair of conveyors 44a which are installed to oppose each other in the Y-axis direction. One pair of clamp devices 45 are driven by clamp-device driver 45M, and are operated to approach or be separated from each other. Transporter 44 receives and transports (carries in) the transport target which has been sent from carry-in part 22 to working position Pw, and transports (carries out) the transport target of working position Pw to the outside.

Figure 3:
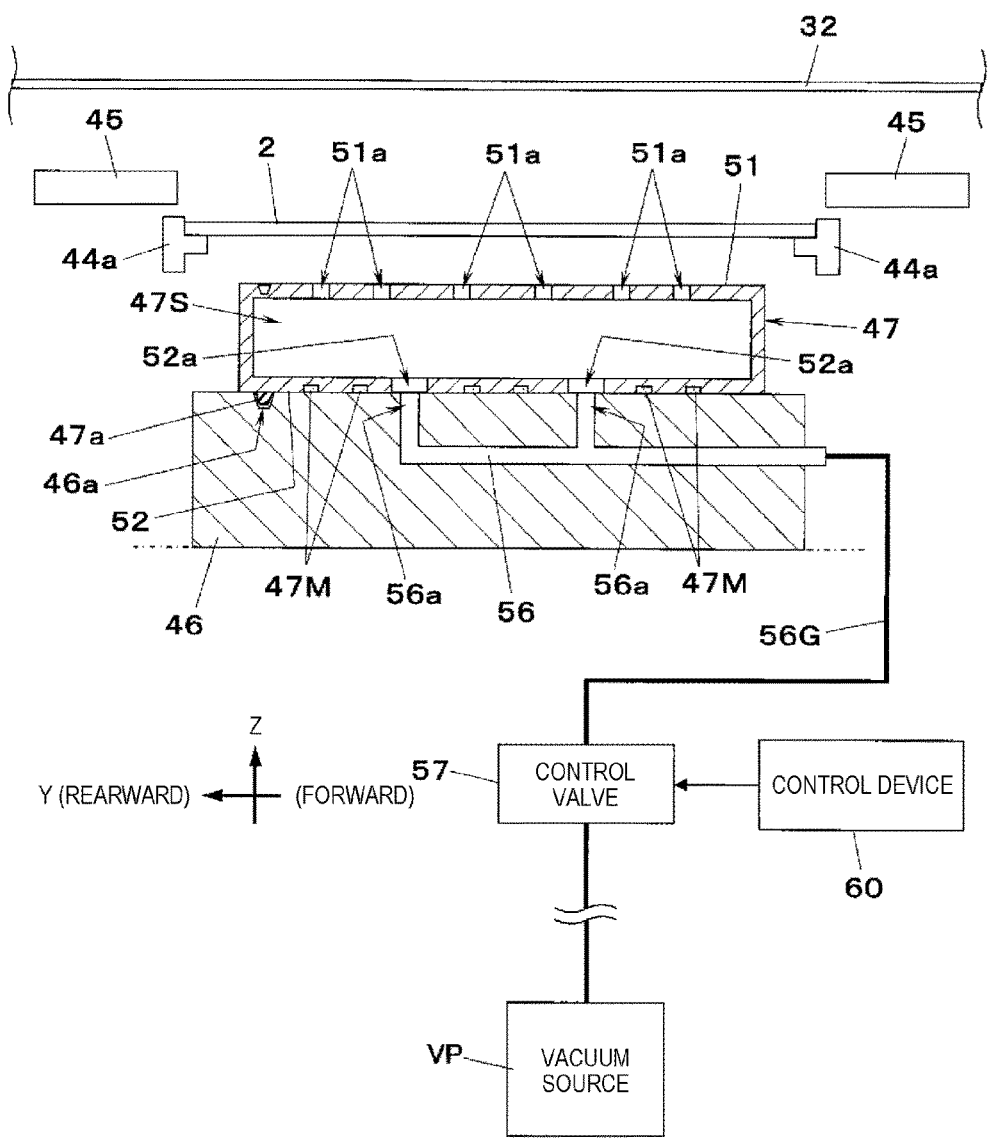
FIG. 3 is a side sectional view of the vicinity of an undersupporting device of the screen printing device provided in the assembly board manufacturing system in the embodiment.

As illustrated in FIGS. 2 and 3, mask 32 is held to be in a horizontal posture above board holding unit 31. Mask 32 is configured of, for example, a metal plate-like device, and at the center thereof, pattern openings (not illustrated) which correspond to each of plural electrodes (not illustrated) formed on the upper surface of board 2, are provided. Squeegee head 33 is configured to include two squeegees 33k which are provided to oppose each other in the Y-axis direction on squeegee base 33b which is driven by head driving mechanism 33M and moves in the Y-axis direction above mask 32; and two cylinders 33s which raise and lower each squeegee 33k with respect to squeegee base 33b.

Figure 4:
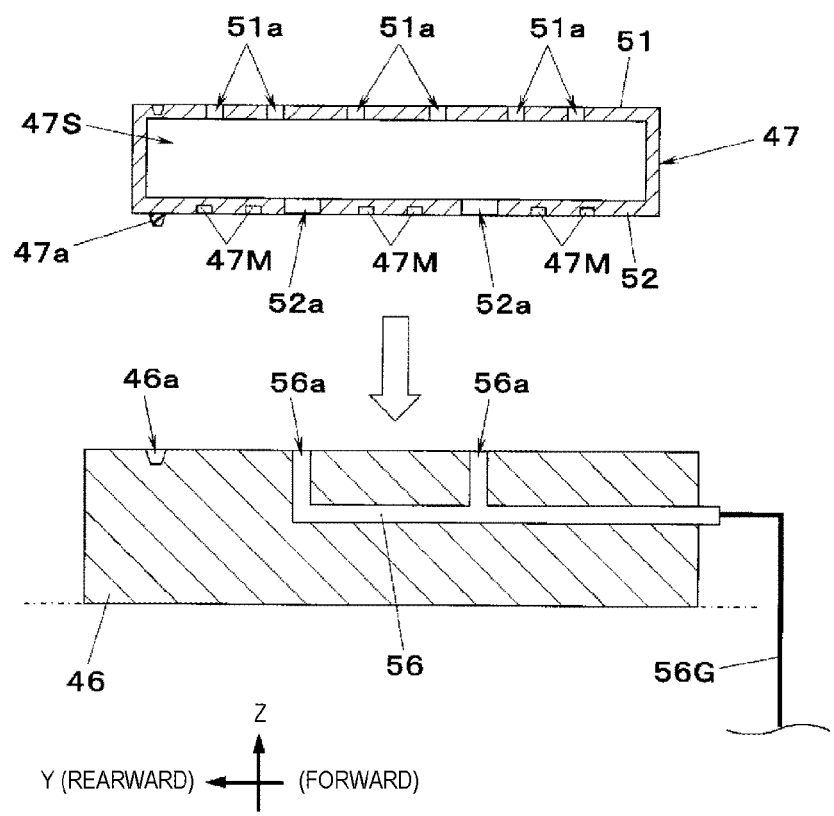
FIG. 4 is a side sectional view illustrating the undersupporting device of the screen printing device provided in the assembly board manufacturing system in the embodiment, together with an undersupporting-device installer.

Undersupporting device 47 is a hollow box-like device which has inner space 47S as illustrated in FIGS. 3 and 4, and is made of a magnetic material. Undersupporting device 47 is a device which supports the lower surface of board 2 that serves as a transport target positioned to working position Pw by transporter 44, and in the embodiment, undersupporting device 47 is configured to suction the lower surface while supporting the lower surface of board 2 positioned to working position Pw by transporter 44.

The upper surface of top board 51 of undersupporting device 47 is a surface which comes into contact with the lower surface of board 2, and is provided with a plurality of suction holes 51a which are open at the upper part thereof. The lower surface of bottom plate 52 of undersupporting device 47 is a surface which comes into contact with the upper surface of undersupporting-device installer 46, and is provided with a plurality of piping connection holes 52a which are open at the lower part thereof.

In FIGS. 3 and 4, a plurality of magnets (magnet 47M) which are embedded to be exposed on the lower surface side, are provided in bottom plate 52 of undersupporting device 47. Meanwhile, a certain region including at least the upper surface of undersupporting-device installer 46 is configured of a magnetic material. Therefore, a magnetic force which pulls undersupporting device 47 and undersupporting-device installer 46 to each other acts therebetween, and undersupporting device 47 is fixed to undersupporting-device installer 46 by the magnetic force when undersupporting device 47 is installed on undersupporting-device installer 46.

As illustrated in FIG. 4, projection 47a which protrudes downward is provided on the lower surface of undersupporting device 47, and recess 46a having a shape that can be fitted to projection 47a is provided on the upper surface of undersupporting-device installer 46. Plural projections 47a and recesses 46a are respectively provided to be aligned in the X-axis direction (the direction perpendicular to a paper surface of FIG. 4), and as the plurality of projections 47a of undersupporting device 47 are fitted to the plurality of recesses 46a of undersupporting-device installer 46, undersupporting device 47 is disposed in undersupporting-device installer 46 in a state of being accurately positioned on undersupporting-device installer 46.

It is preferable that projection 47a is conical, and in this manner, when undersupporting device 47 is installed above undersupporting-device installer 46, even when the center axis of each projection 47a is slightly shifted from the center axis of corresponding recess 46a, it is possible to install undersupporting device 47 at an accurate position on undersupporting-device installer 46. In addition, here, projection 47a is provided on the lower surface of undersupporting device 47, and recess 46a is provided on the upper surface of undersupporting-device installer 46, but the recess may be provided on the lower surface of undersupporting device 47, and the projection may be provided on the upper surface of undersupporting-device installer 46. In other words, in a state where the projection provided in any one of undersupporting device 47 and undersupporting-device installer 46, is fitted to the recess provided in the other one of undersupporting device 47 and undersupporting-device installer 46, undersupporting device 47 may be installed on undersupporting-device installer 46.

In FIGS. 3 and 4, suction piping 56 is formed on the inside of undersupporting-device installer 46, and outlet opening 56a of suction piping 56 is formed on the upper surface of undersupporting-device installer 46. When undersupporting device 47 is installed on undersupporting-device installer 46, outlet opening 56a of suction piping 56 matches piping connection hole 52a provided on bottom plate 52 of undersupporting device 47, and inner space 47S of undersupporting device 47 and suction piping 56 are connected to each other (FIG. 4).

In FIG. 3, suction piping 56 is linked to vacuum source VP through outer piping 56G which extends on the outside of undersupporting-device installer 46, and control valve 57 is interposed in outer piping 56G. When vacuum source VP suctions out the air through outer piping 56G and suction piping 56 in a state where board 2 is in contact with undersupporting device 47, board 2 is suctioned to undersupporting device 47 by a suctioning force generated in suction hole 51a. It is possible to adjust a holding force of board 2 by driving control valve 57 and adjusting the size of the suctioning force generated in suction hole 51a, it is also possible to release the suctioned state of board 2 to undersupporting device 47 by driving control valve 57 and opening suction piping 56 to the atmosphere.

In FIG. 1, when carrying out the transport target, transporter 44 carries out the transport target to carry-out part 24. Carry-out part 24 receives the transport target carried out from transporter 44, and carries out the transport target to the outside (carry-out side relay conveyor 14).

Figure 5:
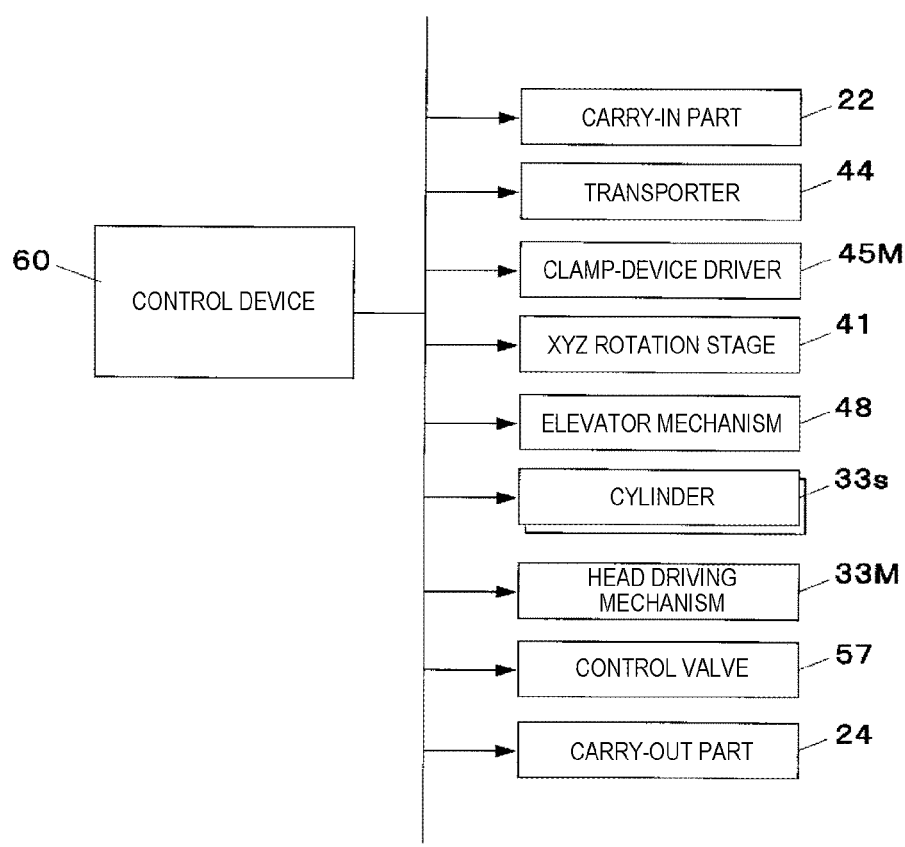
FIG. 5 is a block diagram illustrating an operation system of the screen printing device provided in the assembly board manufacturing system in the embodiment.

In screen printing device 13 having the above-described configuration, operation control of carry-in part 22, operation control of transporter 44, operation control of clamp-device driver 45M, movement control of base part 42 by XYZ rotation stage 41, raising and lowering operation control of base part 42 by elevator mechanism 48, raising and lowering operation control of squeegee 33k by cylinder 33s, movement control of squeegee head 33 by head driving mechanism 33M, and operation control of carry-out part 24, are performed by control device 60 provided in screen printing device 13 (FIG. 5). In addition, control device 60 also performs driving control of control valve 57 (refer to FIG. 3).

In FIG. 1, carry-out side relay conveyor 14 is provided on the downstream process side of screen printing device 13. Carry-out side relay conveyor 14 receives the transport target carried out by carry-out part 24 of screen printing device 13 to the outside, and transports the transport target to component placement device 15.

In FIG. 1, component placement device 15 transports board 2 sent from carry-out side relay conveyor 14 by board transport path 61, positions board 2 at working position Pw, and supports board 2 by board support unit 62 positioned below board transport path 61. In addition, components (not illustrated) are mounted on the electrode of board 2 to which the screen printing is performed in screen printing device 13, by mounting head 63.

Figure 6A:
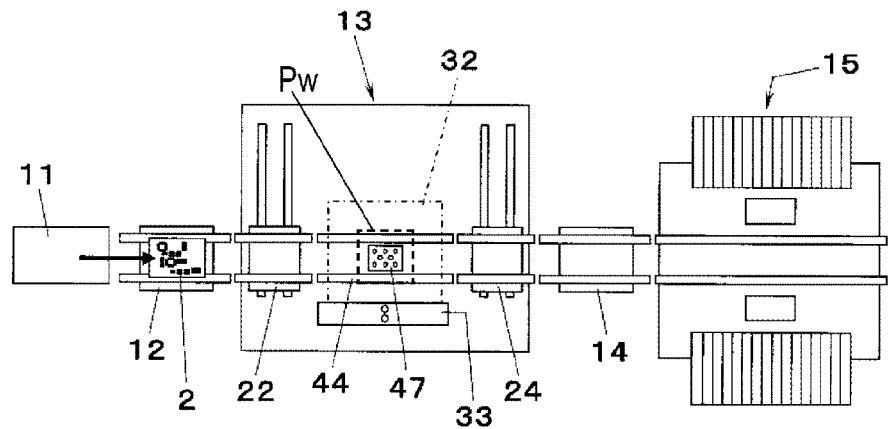
FIGS. 6A to 6C are views illustrating operations when screen printing work is performed by the assembly board manufacturing system in the embodiment.
Figure 6B:
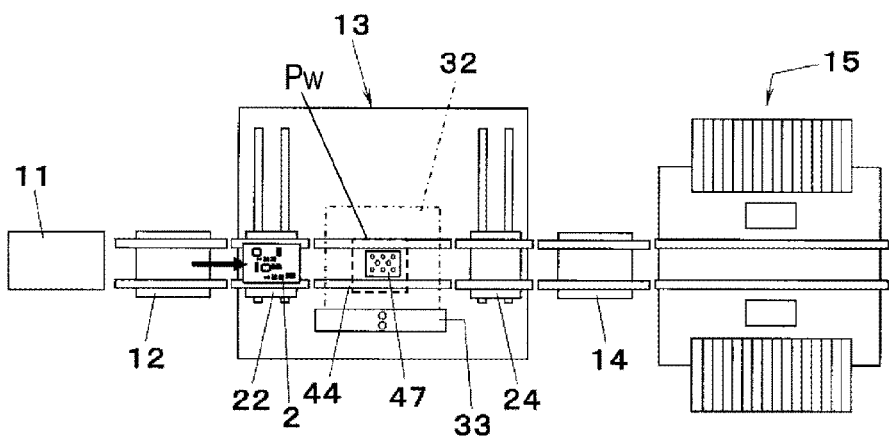
Figure 6C:
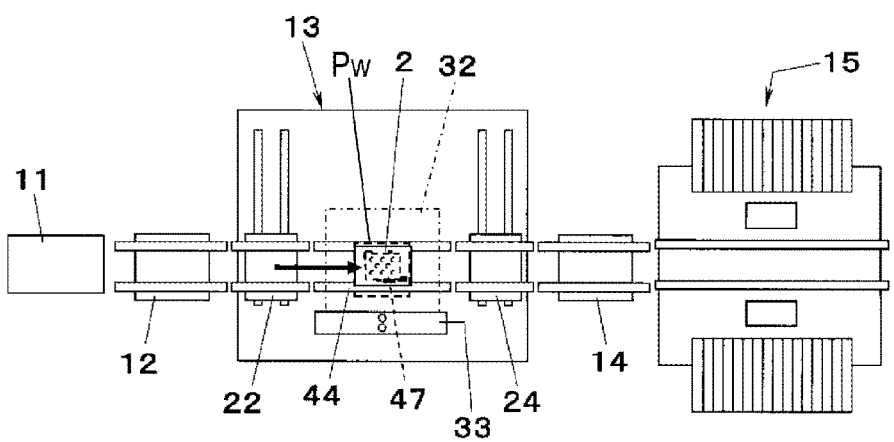
Figure 7A:
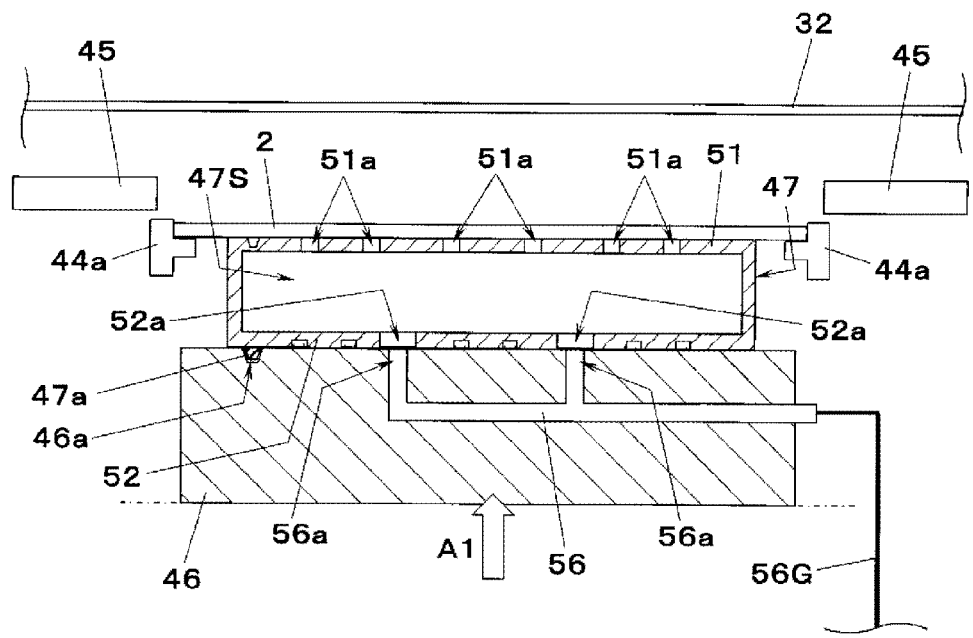
FIGS. 7A and 7B are views illustrating operations when the screen printing work is performed by the assembly board manufacturing system in the embodiment.

Next, an operation when manufacturing an assembly board by assembly board manufacturing system 1, will be described. In manufacturing the assembly board, first, board supplier 11 supplies board 2 to carry-in side relay conveyor 12 (FIG. 6A). Carry-in side relay conveyor 12 which receives board 2 from board supplier 11 delivers board 2 to carry-in part 22 (FIG. 6B). Carry-in part 22 which has received board 2 carries out board 2 to transporter 44, and transporter 44 transports received board 2 to working position Pw (FIG. 6C). When board 2 is transported to working position Pw, elevator mechanism 48 raises undersupporting-device installer 46 (arrow A1 illustrated in FIG. 7A), and the upper surface of undersupporting device 47 is brought into contact with the lower surface of board 2 (FIG. 7A).

When the upper surface of undersupporting device 47 comes into contact with the lower surface of board 2, control device 60 operates control valve 57, and generates the suctioning force to suction hole 51a. Accordingly, board 2 tightly adheres to the upper surface of undersupporting device 47, and even in a case where deformation, such as a warp, is generated in board 2, board 2 is supported by undersupporting device 47 in a state where the deformation is corrected.

Figure 7B:
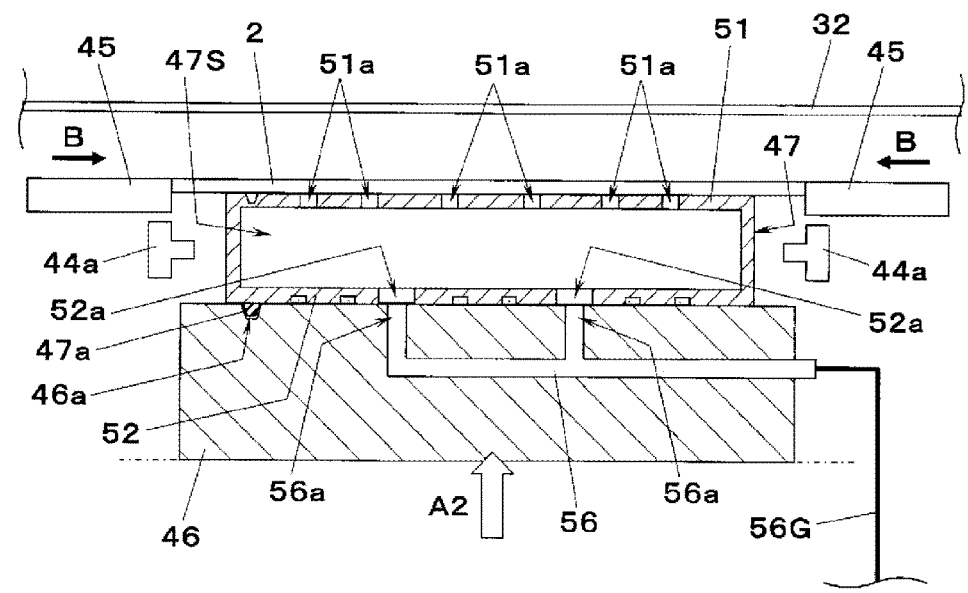

When board 2 is supported by undersupporting device 47, elevator mechanism 48 further raises undersupporting-device installer 46 (arrow A2 illustrated in FIG. 7B). Accordingly, board 2 is lifted up by undersupporting device 47, and is separated from transporter 44 (FIG. 7B). When board 2 is lifted up and the upper surface thereof is raised to have the same height as that of the upper surface of one pair of clamp devices 45, one pair of clamp devices 45 driven by clamp-device driver 45M operates to approach each other, and clamps board 2 from both end sides in the Y-axis direction (arrow B illustrated in FIG. 7B).

Figure 8:
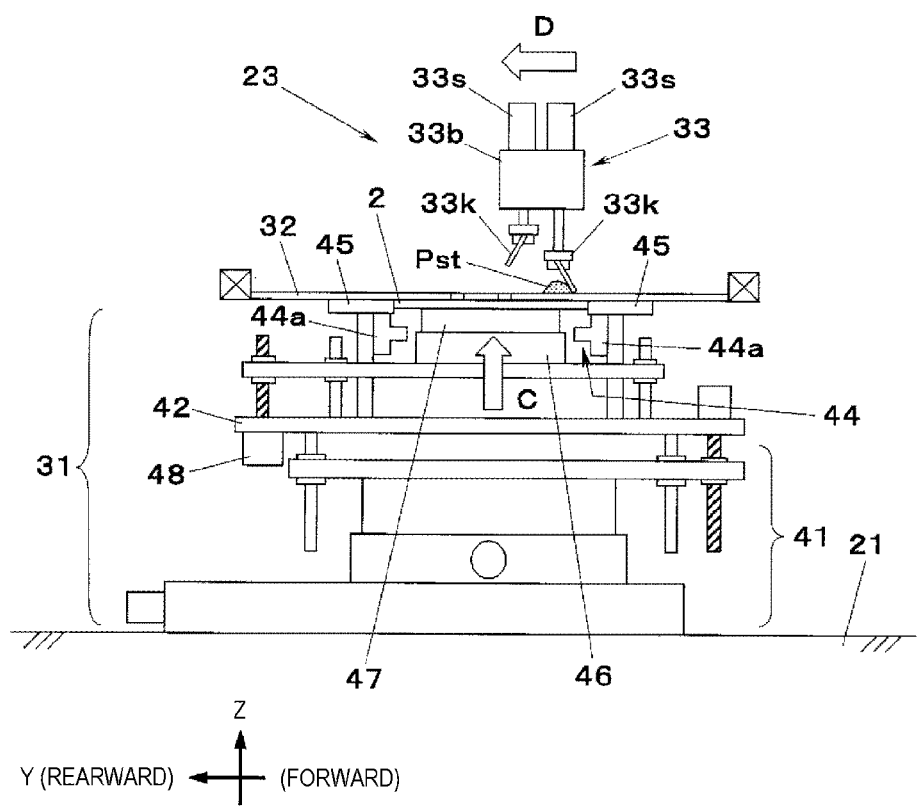
FIG. 8 is a view illustrating operations when the screen printing work is performed by the assembly board manufacturing system in the embodiment.
Figure 9A:
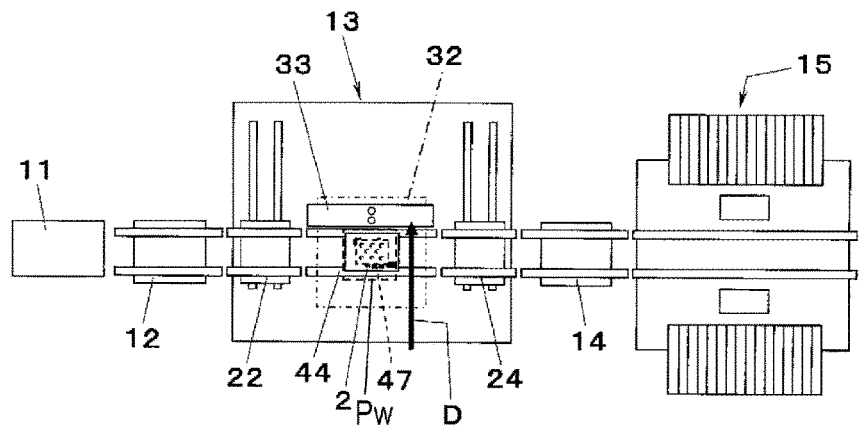
FIGS. 9A to 9C are views illustrating operations when the screen printing work is performed by the assembly board manufacturing system in the embodiment.

When one pair of clamp devices 45 clamps board 2, XYZ rotation stage 41 operates, board 2 is horizontally moved such that the pattern opening of mask 32 and the electrode of board 2 vertically match each other, and then, base part 42 is raised (arrow C illustrated in FIG. 8). Accordingly, when the upper surface of board 2 comes into contact with the lower surface of mask 32, squeegee head 33 lowers one squeegee 33k by cylinder 33s, and allows the lower end of squeegee 33k to abut against the upper surface of mask 32 (FIG. 8). When the lower end of squeegee 33k abuts against the upper surface of mask 32, head driving mechanism 33M operates, moves squeegee head 33 in the Y-axis direction (arrow D illustrated in FIGS. 8 and 9A), and slidably moves squeegee 33k on mask 32. Accordingly, paste Pst which has been supplied in advance onto mask 32 is scraped by squeegee 33k, and paste Pst is printed on the electrode of board 2 through the opening of mask 32.

Figure 9B:
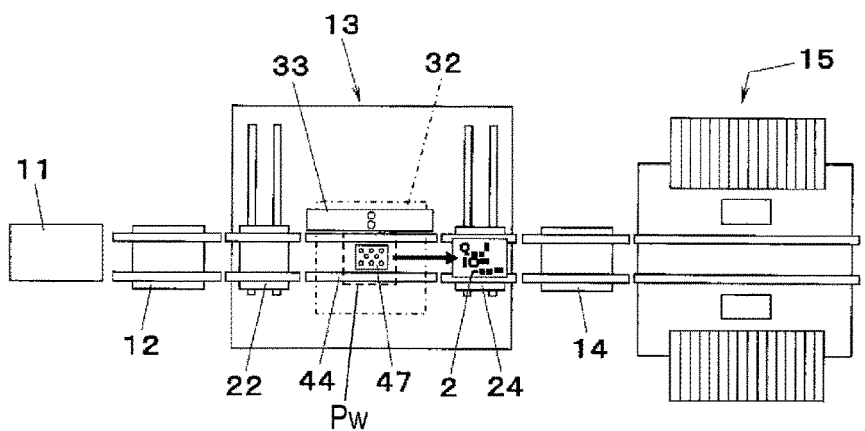
Figure 9C:
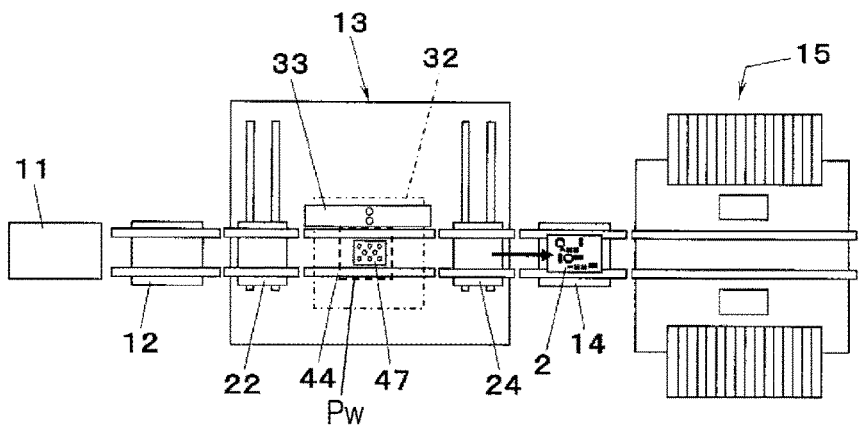

When paste Pst is printed on the electrode of board 2, XYZ rotation stage 41 operates, base part 42 is lowered, and board 2 is separated (plate releasing) from mask 32. When board 2 is separated from mask 32, control device 60 operates control valve 57 and releases the suctioned state of board 2. When the suctioned state of board 2 is released, one pair of clamp devices 45 operate in the direction in which clamp devices 45 are separated from each other and releases the clamp of board 2, and elevator mechanism 48 lowers undersupporting-device installer 46 and loads board 2 on transporter 44 (FIG. 3). When board 2 is loaded on transporter 44, transporter 44 transports board 2, and carries out board 2 to carry-out part 24 (FIG. 9B). Carry-out part 24 receives board 2 (board 2 to which the screen printing is performed) carried out by transporter 44, and delivers board 2 to carry-out side relay conveyor 14 (FIG. 9C). Accordingly, the screen printing for one board 2 by screen printing device 13 is finished.

Carry-out side relay conveyor 14 carries out board 2 received from screen printing device 13 to component placement device 15. Component placement device 15 receives board 2 carried out by carry-out side relay conveyor 14, by board transport path 61, and positions board 2 at working position Pw, and after board 2 is supported by board support unit 62, the components are mounted on board 2 by mounting head 63. In addition, when all of the components to be mounted on board 2 are mounted, board 2 is carried out to the outside (downstream process side).

In assembly board manufacturing system 1 having the configuration, installation and detachment of undersupporting device 47 provided in screen printing device 13 can be respectively automatically performed, and the order thereof will be described hereinafter.

In a case of automatically installing undersupporting device 47 on undersupporting-device installer 46 of screen printing device 13, carrier 71 (FIGS. 10A and 10B) which is formed in a shape of a board, is used. A plurality of magnets (magnet 71M) are provided on the lower surface of carrier 71 to be exposed downward. As described above, since undersupporting device is configured of a magnetic material, and magnet 71M pulls undersupporting device 47 by the magnetic force, when the upper surface of undersupporting device 47 comes into contact with the lower surface of carrier 71, and undersupporting device 47 is held by carrier 71. In this manner, in the embodiment, magnet 71M is provided on the lower surface of carrier 71, and undersupporting device 47 is held on the lower surface of carrier 71 by the magnetic force shown by magnet 71M.

Here, magnet 71M shows a pulling magnetic force which is weaker than the pulling magnetic force by which magnet 47M provided in undersupporting device 47 pulls undersupporting-device installer 46, and a magnetic force which pulls undersupporting device 47. In other words, the pulling force between undersupporting device 47 and carrier 71 is weaker than the pulling force between undersupporting device 47 and undersupporting-device installer 46.

Figure 10A:
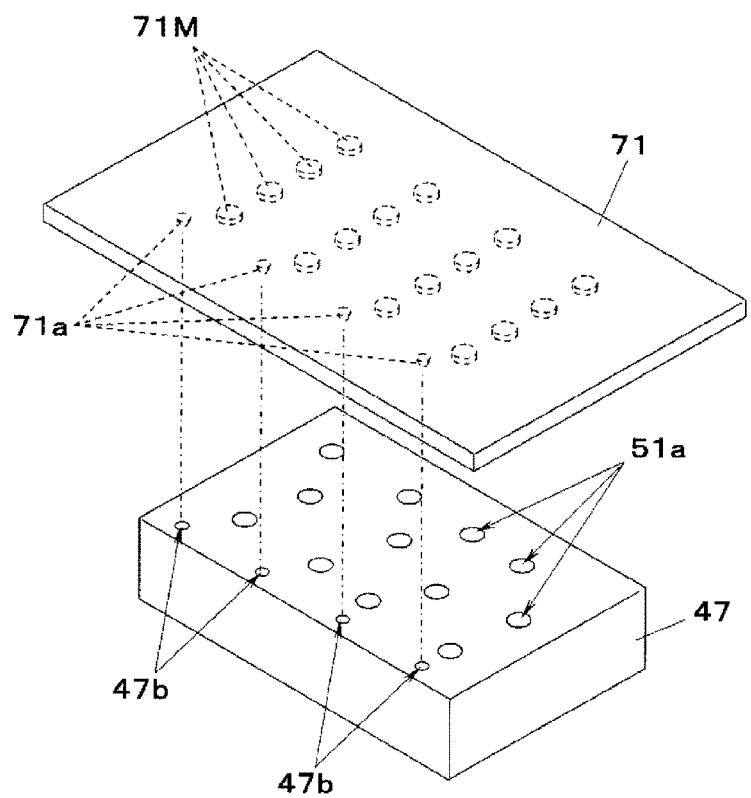
FIGS. 10A and 10B are perspective views illustrating the undersupporting device of the screen printing device provided in the assembly board manufacturing system in the embodiment, together with a carrier.
Figure 10B:
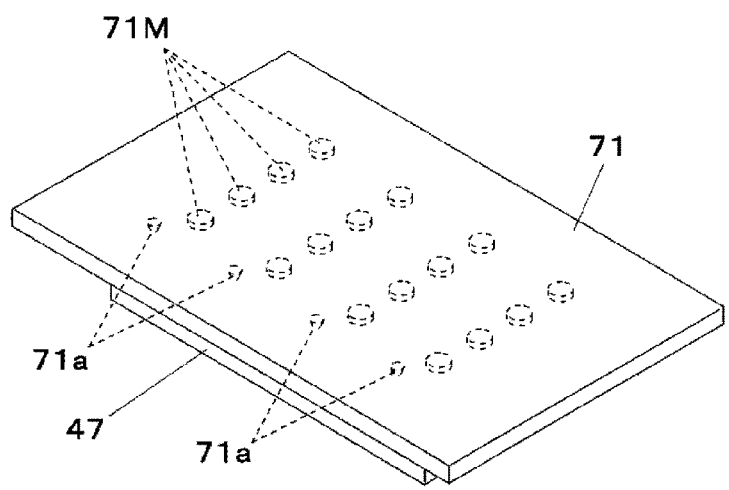

As illustrated in FIGS. 10A and 10B, a plurality of projections 71a which protrude downward are provided on the lower surface of carrier 71, and a plurality of holes 47b having a shape which can be fitted to each projection 71a are provided on the upper surface of undersupporting device 47. As the plurality of projections 71a of carrier 71 are fitted to the plurality of holes 47b of undersupporting device 47, undersupporting device 47 is accurately held at a predetermined holding position with respect to carrier 71.

Figure 11A:
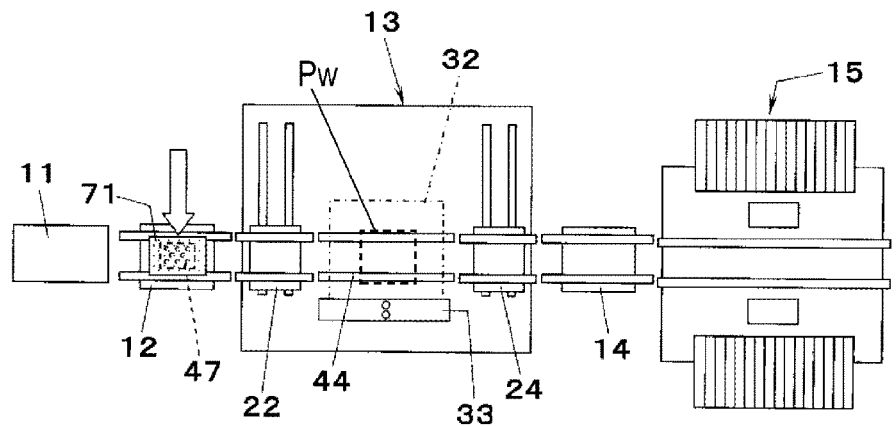
FIGS. 11A to 11C are views illustrating operations when installation work of the undersupporting device is performed by the assembly board manufacturing system in the embodiment.
Figure 11B:
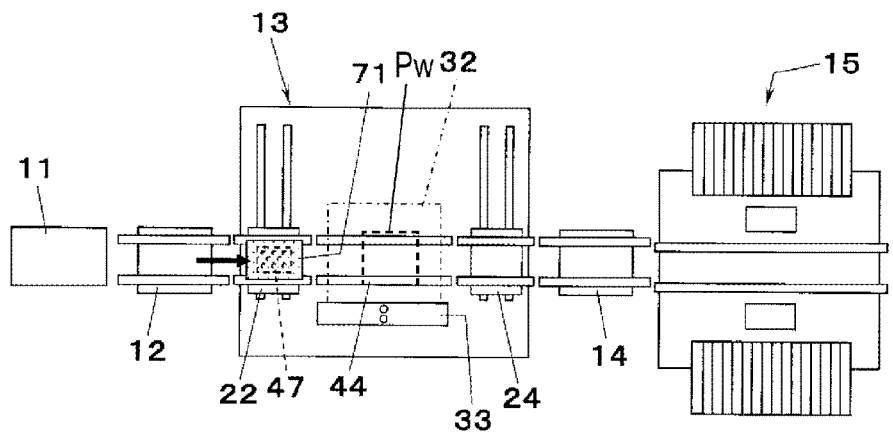
Figure 11C:
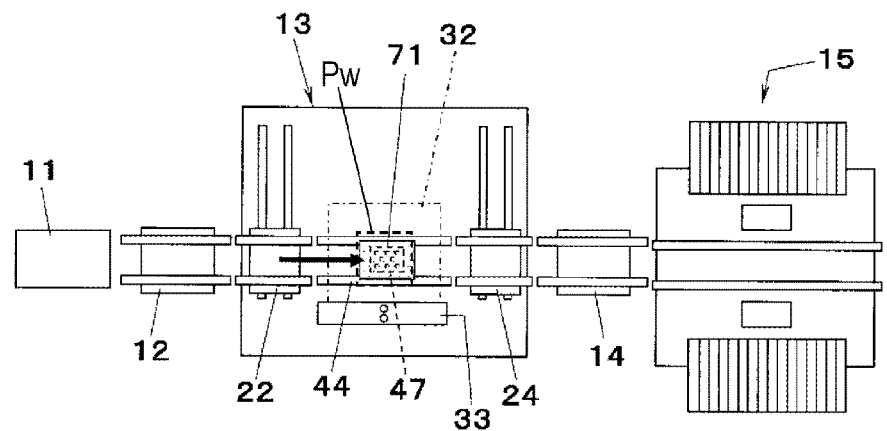

In a case of installing undersupporting device 47 on undersupporting-device installer 46, operator OP inputs (supplies) carrier 71 which holds undersupporting device 47 to carry-in side relay conveyor 12 (undersupporting device supplying process, FIG. 11A). Carry-in side relay conveyor 12 which receives carrier 71 that holds undersupporting device 47 delivers carrier 71 to carry-in part 22 (FIG. 11B). Carry-in part 22 delivers carrier 71 received from carry-in side relay conveyor 12 to transporter 44, and then, transporter 44 transports received carrier 71 to working position Pw (FIG. 11C). In other words, by transporting carrier 71 which holds undersupporting device 47 to working position Pw, transporter 44 positions undersupporting device 47 to working position Pw (undersupporting device transporting process).

Figure 12A:
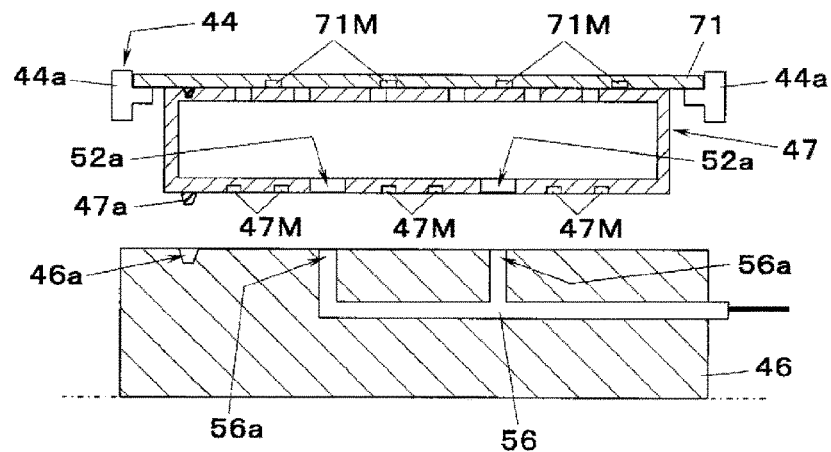
FIGS. 12A to 12C are views illustrating operations when the installation work of the undersupporting device is performed by the assembly board manufacturing system in the embodiment.
Figure 12B:
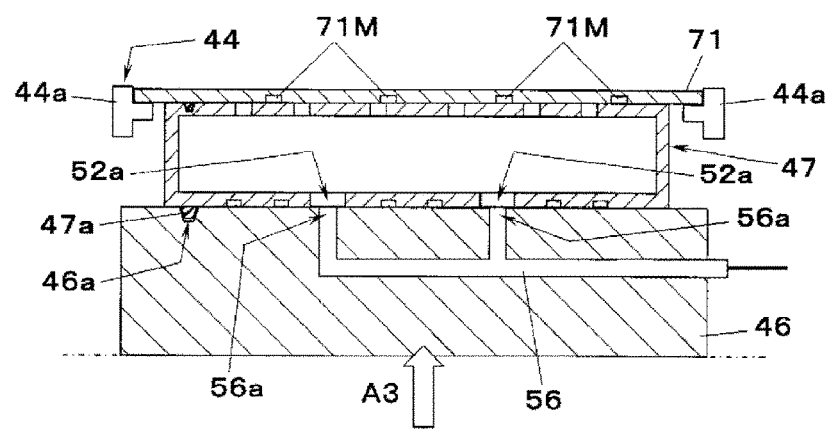

As transporter 44 transports carrier 71 to working position Pw, when undersupporting device 47 held by carrier 71 is positioned to working position Pw (above undersupporting-device installer 46) (FIG. 12A), elevator mechanism 48 installs undersupporting device 47 on undersupporting-device installer 46 (undersupporting device installing process). Specifically, first, as elevator mechanism 48 raises undersupporting-device installer 46 (arrow A3 illustrated in FIG. 12B) and brings the upper surface of undersupporting-device installer 46 into contact with the lower surface of undersupporting device 47, undersupporting device 47 held by carrier 71 is fixed to undersupporting-device installer 46 by the magnetic force between magnet 47M and undersupporting-device installer 46 (at this time, the plurality of recesses 46a on undersupporting-device installer 46 side is fitted to the plurality of projections 47a on undersupporting device 47 side). In this manner, when undersupporting device 47 is fixed to undersupporting-device installer 46, elevator mechanism 48 lowers undersupporting-device installer 46 (arrow A4 in FIG. 12C).

Figure 12C:
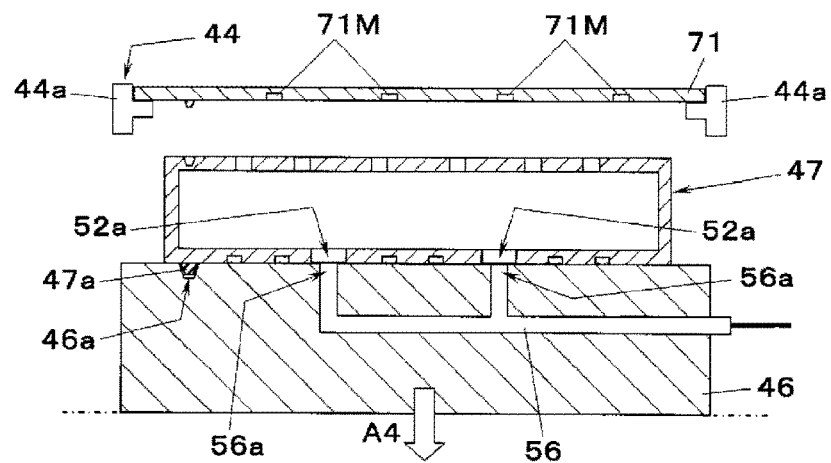

As described above, in the raising and lowering operation of undersupporting-device installer 46, when undersupporting-device installer 46 comes into contact with the lower surface of undersupporting device 47 held by carrier 71, undersupporting device 47 receives the pulling force between undersupporting device 47 and carrier 71 and the pulling force between undersupporting device 47 and undersupporting-device installer 46, but as described above, the pulling force between undersupporting device 47 and carrier 71 is weaker than the pulling force between undersupporting device 47 and undersupporting-device installer 46. Therefore, after this, when undersupporting-device installer 46 is lowered, undersupporting device 47 is separated from carrier 71 and is placed in a state of being installed on undersupporting-device installer 46 (FIG. 12C).

Figure 13A:
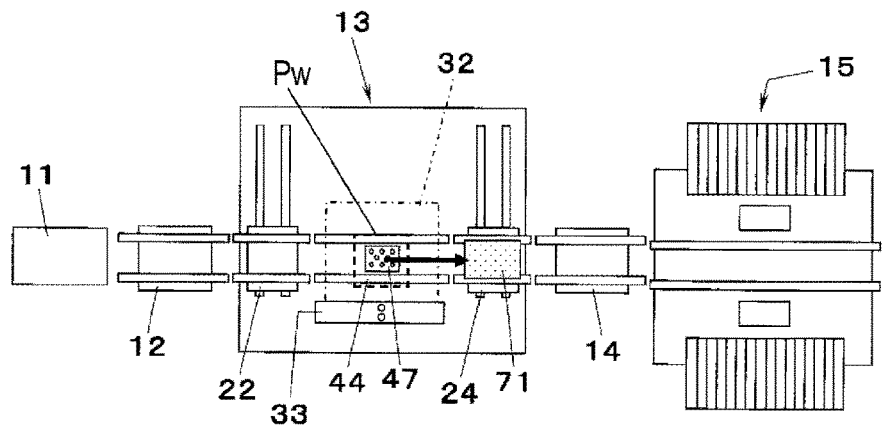
FIGS. 13A to 13C are views illustrating operations when the installation work of the undersupporting device is performed by the assembly board manufacturing system in the embodiment.
Figure 13B:
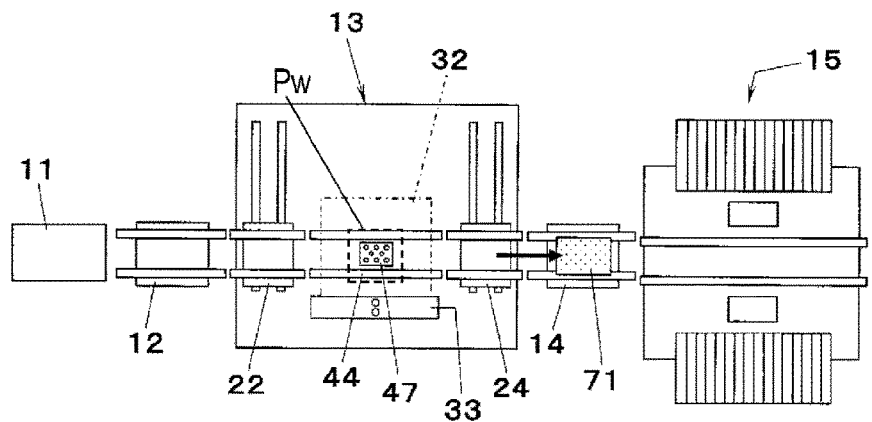
Figure 13C:
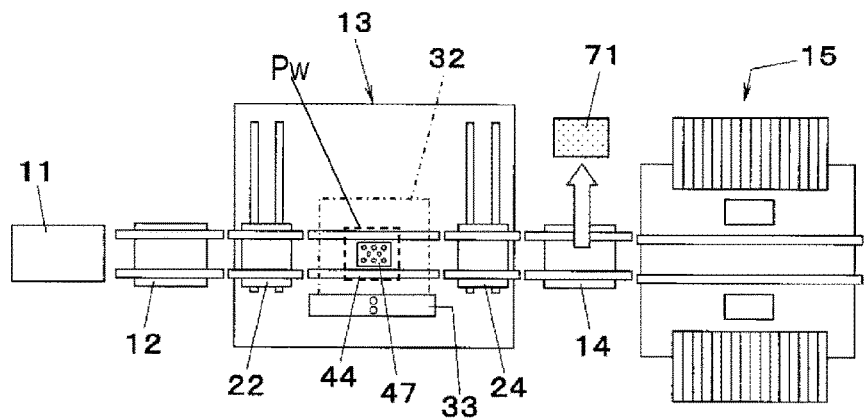

As described above, when undersupporting device 47 is installed on undersupporting-device installer 46, transporter 44 transports carrier 71 separated from undersupporting device 47, and delivers carrier 71 to carry-out part 24 (FIG. 13A). In addition, carry-out part 24 which has received carrier 71 carries out carrier 71 to carry-out side relay conveyor 14 (FIG. 13B). When carrier 71 is carried out to carry-out side relay conveyor 14, operator OP picks up and collects carrier 71 from carry-out side relay conveyor 14 (FIG. 13C). Accordingly, the installation of undersupporting device 47 on screen printing device 13 is completed.

Figure 14A:
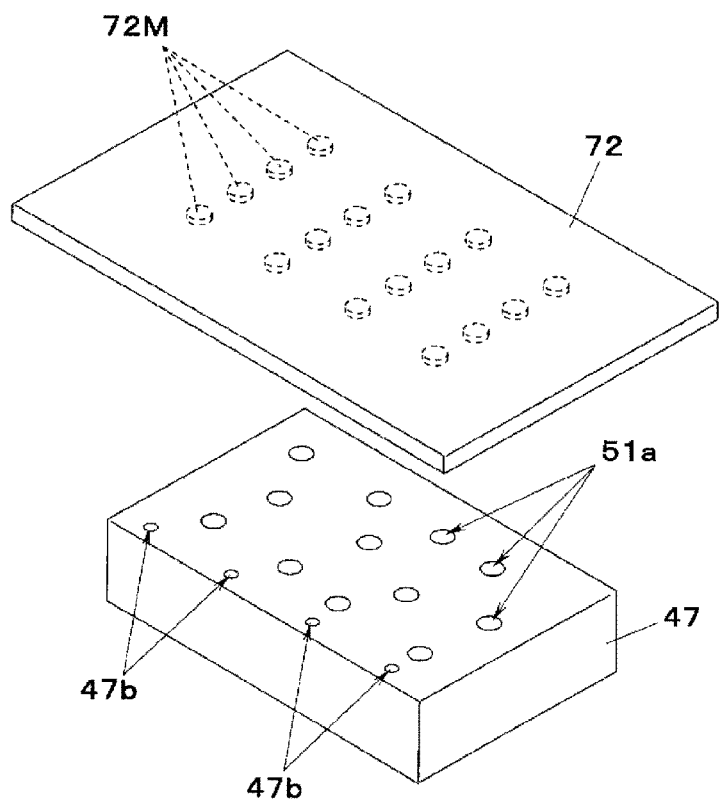
FIGS. 14A and 14B are perspective views illustrating the undersupporting device of the screen printing device provided in the assembly board manufacturing system in the embodiment, together with the carrier.
Figure 14B:
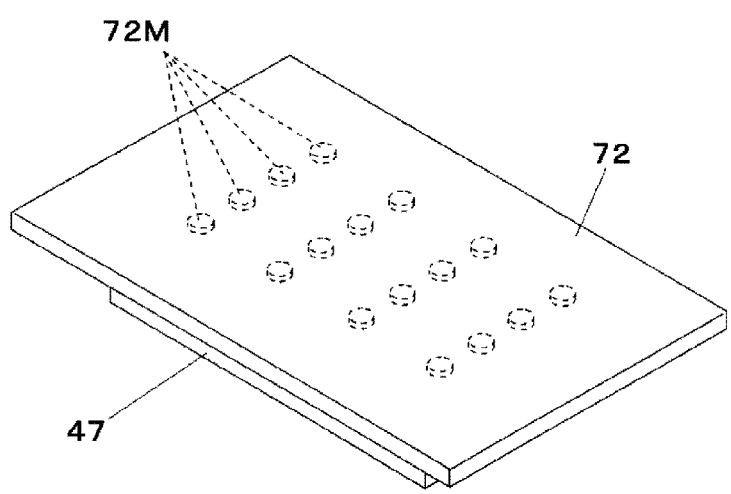

In a case of automatically collecting undersupporting device 47 installed on screen printing device 13, carrier 72 formed in a shape of a board is used (FIGS. 14A and 14B). In FIGS. 14A and 14B, a plurality of magnets (carrier magnet 72M) are provided on the lower surface of carrier 72 to be exposed downward. As described above, since undersupporting device 47 is configured of a magnetic material, and carrier magnet 72M pulls undersupporting device 47 by the magnetic force, when the upper surface of undersupporting device 47 comes into contact with the lower surface of carrier 72, and undersupporting device 47 can be held by carrier 72. In addition, carrier magnet 72M provided in carrier 72 shows the pulling force which is stronger than the magnetic force by which magnet 47M provided in undersupporting device 47 pulls undersupporting-device installer 46. In other words, the pulling force between undersupporting device 47 and carrier 72 is stronger than the pulling force between undersupporting device 47 and undersupporting-device installer 46.

Figure 15A:
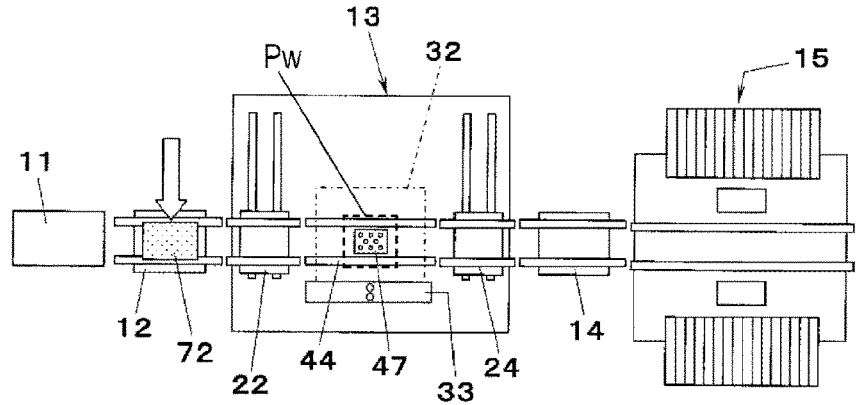
FIGS. 15A to 15C are views illustrating operations when collection work of the undersupporting device is performed by the assembly board manufacturing system in the embodiment.
Figure 15B:
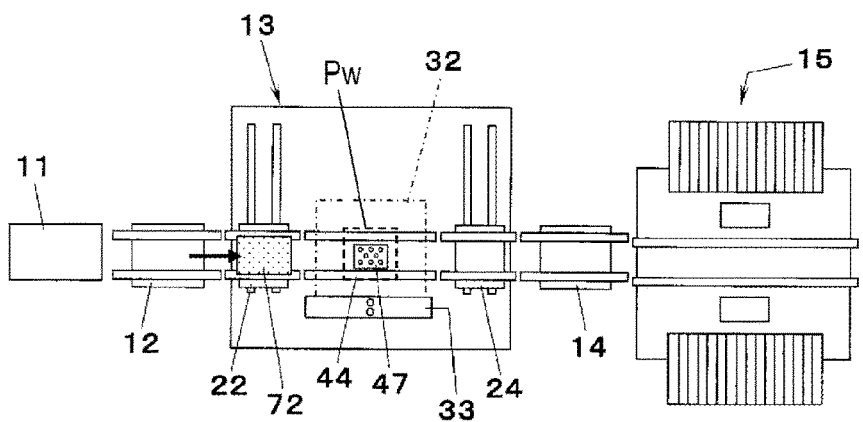
Figure 15C:
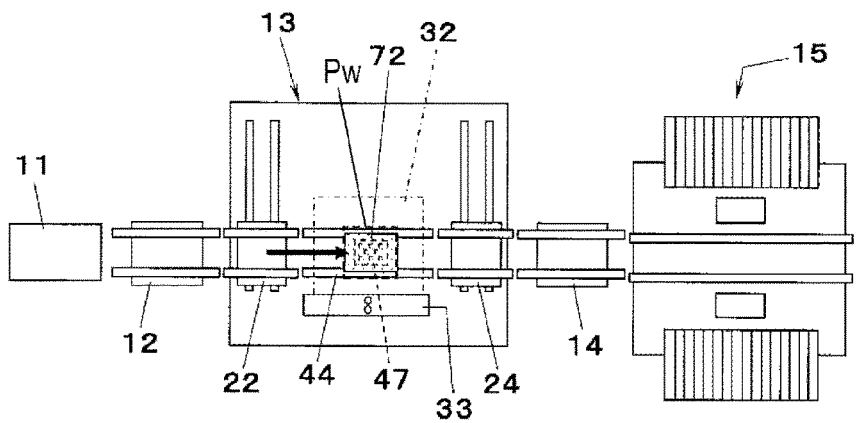

In a case of collecting undersupporting device 47 installed on undersupporting-device installer 46, operator OP inputs (supplies) carrier 72 to carry-in side relay conveyor 12 (carrier supplying process, FIG. 15). Carry-in side relay conveyor 12 which has received carrier 72 delivers carrier 72 to carry-in part 22 (FIG. 15B). Carry-in part 22 delivers carrier 72 received from carry-in side relay conveyor 12 to transporter 44, and then, transporter 44 transports received carrier 72 to working position Pw (FIG. 15C).

Figure 16A:
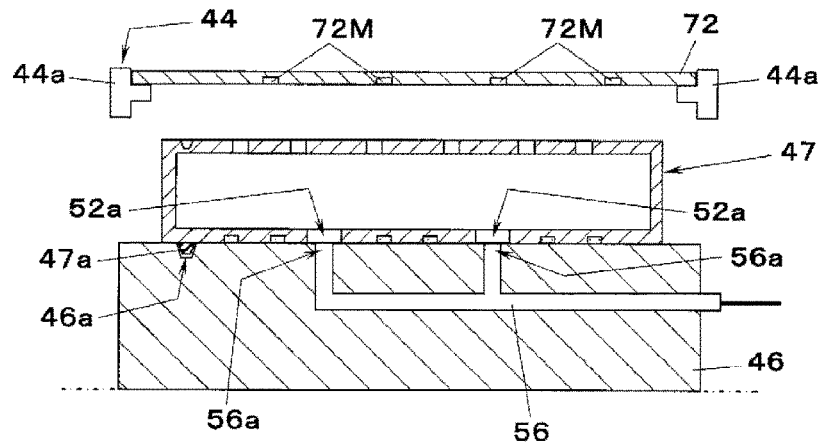
FIGS. 16A to 16C are views illustrating operations when the collection work of the undersupporting device is performed by the assembly board manufacturing system in the embodiment.

When carrier 72 is positioned above undersupporting device 47 installed on undersupporting-device installer 46 as transporter 44 transports carrier 72 to working position Pw (FIG. 16A), undersupporting device 47 installed on undersupporting-device installer 46 is detached from undersupporting-device installer 46 and is delivered to transporter 44

Figure 16B:
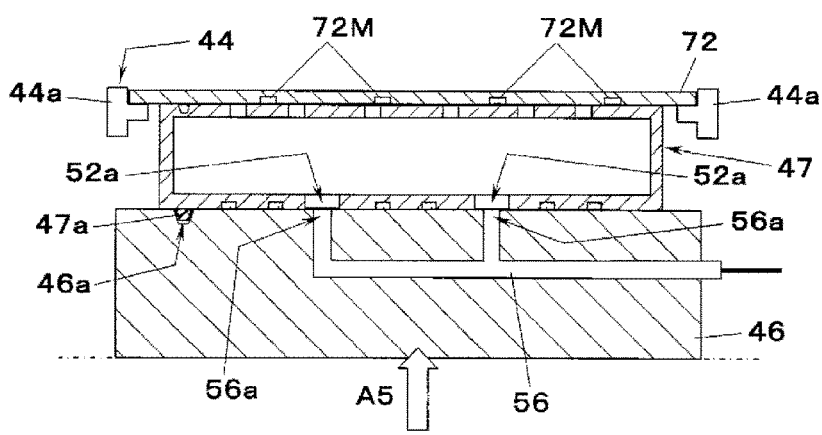

(undersupporting device detaching process). Specifically, first, as elevator mechanism 48 raises undersupporting-device installer 46 (arrow A5 illustrated in FIG. 16B) and brings the upper surface of undersupporting device 47 into contact with the lower surface of carrier 72, undersupporting device 47 is held by carrier 72 by the magnetic force between carrier magnet 72M and undersupporting device 47. In addition, when undersupporting device 47 is held by carrier 72 in this manner (FIG. 16B), elevator mechanism 48 lowers undersupporting-device installer 46 (arrow A6 illustrated in FIG. 16C).

Figure 16C:
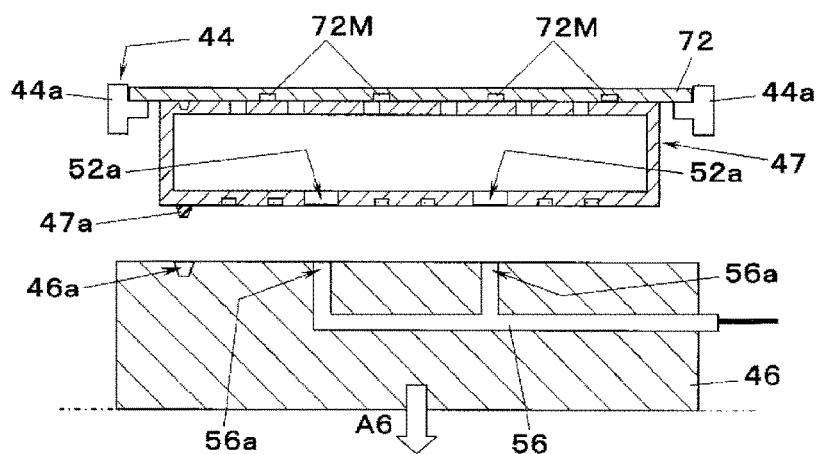

In the raising and lowering operation of undersupporting-device installer 46 as described above, when carrier 72 comes into contact with the upper surface of undersupporting device 47, undersupporting device 47 receives the pulling force between undersupporting device 47 and undersupporting-device installer 46 and the pulling force between undersupporting device 47 and carrier 72, but as described above, the pulling force between undersupporting device 47 and carrier 72 is stronger than the pulling force between undersupporting device 47 and undersupporting-device installer 46. Therefore, after this, when undersupporting-device installer 46 is lowered, undersupporting device 47 is separated from undersupporting-device installer 46, is delivered to carrier 72, and is placed in a state of being detached from undersupporting-device installer 46 (FIG. 16C).

Figure 17A:
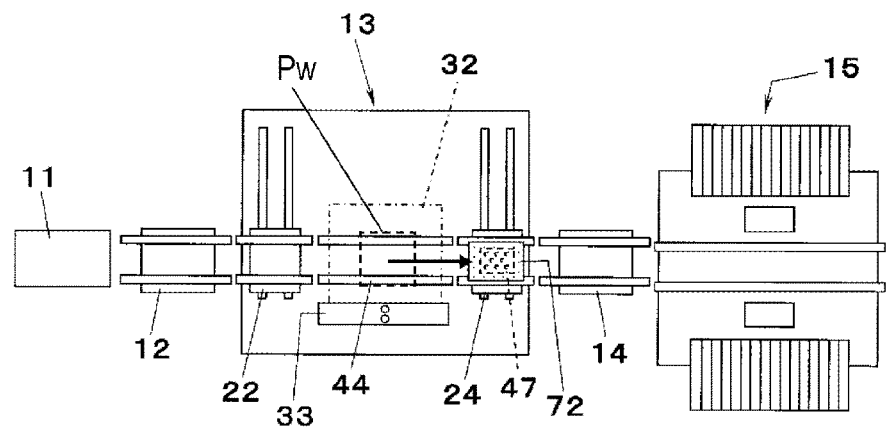
FIGS. 17A to 17C are views illustrating operations when the collection work of the undersupporting device is performed by the assembly board manufacturing system in the embodiment.
Figure 17B:
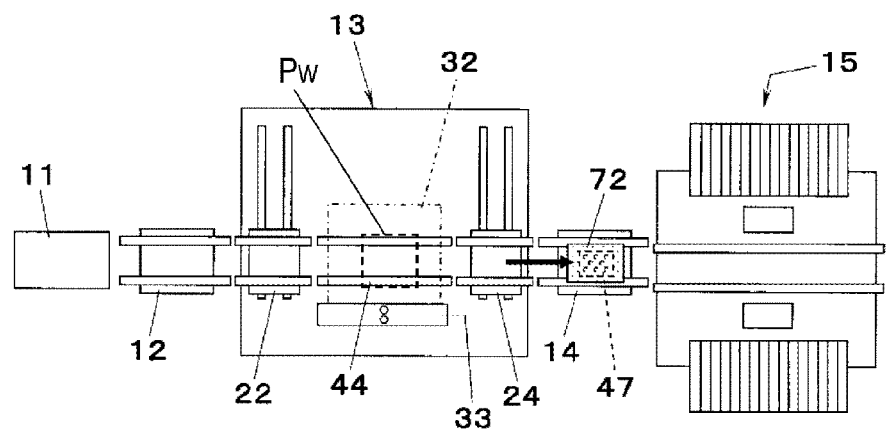
Figure 17C:
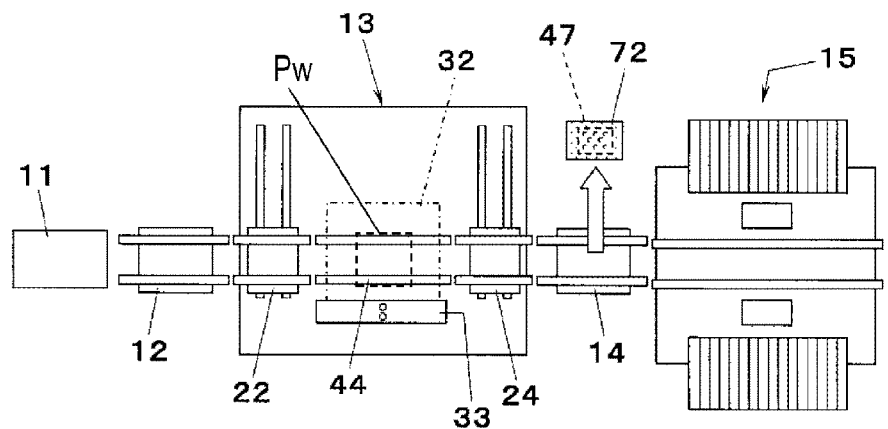

As described above, when undersupporting device 47 is delivered to carrier 72, transporter 44 delivers carrier 72 to carry-out part 24 (FIG. 17A), and then, carry-out part 24 carries out carrier 72 received from transporter 44 to carry-out side relay conveyor 14 (undersupporting device carrying out process, FIG. 17B). When carrier 72 which holds undersupporting device 47 is carried out to carry-out side relay conveyor 14, operator OP picks up carrier 72 from carry-out side relay conveyor 14 (FIG. 17C). By transporting carrier 72 which holds undersupporting device 47, transporter 44 carries out undersupporting device 47 from working position Pw. Accordingly, the collection of undersupporting device 47 from screen printing device 13 is completed.

According to the above-described order, it is possible to install undersupporting device 47 to screen printing device 13, and to collect undersupporting device 47 from screen printing device 13. However, after collecting undersupporting device 47, by continuously performing the installation work of undersupporting device 47, it is possible to automatically perform exchange work of undersupporting device 47 in the middle of producing the assembly boards.

As described above, carrier 71 configured to hold undersupporting device 47. Transporter 44 is configured to transport board 2 and carrier 71. Undersupporting-device installer 46 is provided below transporter 44, and is attachable to and detachable from undersupporting device 47. Board processor (32, 33) is configured to perform a predetermined processing to an upper surface of board 2. Magnet 47M is provided on a lower surface of undersupporting device 47. Transporter 44 transports undersupporting device 47 to working position Pw by transporting carrier 71 to working position Pw while carrier 71 holds undersupporting device 47 on the lower surface of carrier 71. Transported undersupporting device 47 is fixed to undersupporting-device installer 46 by a magnetic force of magnet 47M at working position Pw. Transporter 44 transports board 2 to working position Pw. Undersupporting device 47 supports the lower surface of board 2 when board 2 is transported to working position Pw. Board processor (32, 33) performs the predetermined processing to the upper surface of board 2 while undersupporting device 47 is fixed to undersupporting-device installer 46 and undersupporting device 47 supports the lower surface of board 2.

The system may include magnet 71M provided on the lower surface of carrier 71. In this case, carrier 71 holds undersupporting device 47 on the lower surface of carrier 71 by a magnetic force of magnet 71M.

The system may further include elevator mechanism 48 configured to raise and lower undersupporting-device installer 46. In this case, elevator mechanism 48 is configured to raise undersupporting-device installer 46 as to fix, to undersupporting-device installer 46, undersupporting device 47 held by carrier 71. Elevator mechanism 48 is configured to install undersupporting device 47 on undersupporting-device installer 46 by lowering undersupporting-device installer 46 while undersupporting device 47 is fixed to undersupporting-device installer 46.

The system may further include carrier 72 configured to hold undersupporting device 47. In this case, wherein elevator mechanism 48 is configured to raise undersupporting-device installer 46 to cause carrier 72 to hold undersupporting device 47. Elevator mechanism 48 is configured to detach undersupporting device 47 from undersupporting-device installer 46 by lowering undersupporting-device installer 46 while carrier 72 holds undersupporting device 47.

Transporter 44 may transport undersupporting device 47 from working position Pw by transporting carrier 72 while carrier 72 holds undersupporting device 47.

The system may further include elevator mechanism 48 configured to raise and lower undersupporting-device installer 46, and carrier 72 configured to hold undersupporting device 47. In this case, elevator mechanism 48 is configured to raise undersupporting-device installer 46 to cause carrier 72 to hold undersupporting device 47. Elevator mechanism 48 is configured to detach undersupporting device 47 from undersupporting-device installer 46 by lowering undersupporting-device installer 46 while carrier 72 holds undersupporting device 47.

Transporter 44 may transport undersupporting device 47 from working position Pw by transporting carrier 72 while carrier 72 holds undersupporting device 47.

Undersupporting device 47 may suction board 2 while supporting lower surface of the board 2 transported to working position Pw by transporter 44.

One of undersupporting device 47 and undersupporting-device installer 46 may have projection 47a. In this case, another of undersupporting device 47 and undersupporting-device installer 46 has recess 46a provided therein. Undersupporting device 47 is installed on the undersupporting-device installer 46 while projection 47a is fitted to recess 46a.

Undersupporting device 47 is positioned at working position Pw by causing transporter 44 to transport carrier 71 to working position Pw while carrier 71 holds undersupporting device 47. Undersupporting device 47 positioned at working position Pw is fixed to undersupporting-device installer 46 by a magnetic force of magnet 47M. Undersupporting device 47 is installed, by the above method, to the system for manufacturing an assembly board.

What is claimed is:

1. A system for manufacturing an assembly board, comprising:
   an undersupporting device comprising a hollow box with a top board;
   a first carrier configured to hold the undersupporting device;

an undersupporting-device installer made of a magnetic material, the undersupporting-device installer being attachable to and detachable from the undersupporting device; and
a first magnet provided on a lower surface of the undersupporting device,
wherein the system is configured to operate such that: the undersupporting device is moved to a working position by transporting the first carrier to the working position while the first carrier holds the undersupporting device on a lower surface of the first carrier,
the undersupporting device is fixed to the undersupporting-device installer by a magnetic force of the first magnet at the working position,
the undersupporting device supports a lower surface of the board, and
a processing step can be performed on the upper surface of the board while the undersupporting device is fixed to the undersupporting-device installer and the undersupporting device supports the lower surface of the board.

2. The system of claim 1, further comprising
a second magnet provided on the lower surface of the first carrier,
wherein the first carrier holds the undersupporting device on the lower surface of the first carrier by a magnetic force of the second magnet.

3. The system of claim 1, further comprising:
an elevator mechanism configured to raise and lower the undersupporting-device installer,
wherein the elevator mechanism is configured to:
raise the undersupporting-device installer as to fix, to the undersupporting-device installer, the undersupporting device held by the first carrier; and
install the undersupporting device on the undersupporting-device installer by lowering the undersupporting-device installer while the undersupporting device is fixed to the undersupporting-device installer.

4. The system of claim 3, further comprising
a second carrier configured to hold the undersupporting device,
wherein the elevator mechanism is configured to:
raise the undersupporting-device installer to cause the second carrier to hold the undersupporting device; and
detach the undersupporting device from the undersupporting-device installer by lowering the undersupporting-device installer while the second carrier holds the undersupporting device.

5. The system of claim 4, further comprising a transporter configured to transport the undersupporting device by transporting one of the first carrier and the second carrier while the first carrier or the second carrier holds the undersupporting device.

6. The system of claim 1, further comprising:
an elevator mechanism configured to raise and lower the undersupporting-device installer; and
a second carrier configured to hold the undersupporting device,
wherein the elevator mechanism is configured to:
raise the undersupporting-device installer to cause the second carrier to hold the undersupporting device; and
detach the undersupporting device from the undersupporting-device installer by lowering the undersupporting-device installer while the second carrier holds the undersupporting device.

7. The system of claim 6, further comprising a transporter configured to transport the undersupporting device by transporting one of the first carrier and the second carrier while the first carrier or the second carrier holds the undersupporting device.

8. The system of claim 1, wherein the undersupporting device suctions the board while supporting the lower surface of the board transported to the working position by the transporter.

9. The system of claim 1,
wherein one of the undersupporting device and the undersupporting-device installer has a projection,
wherein another of the undersupporting device and the undersupporting-device installer has a recess provided therein, and
wherein the undersupporting device is installed on the undersupporting-device installer while the projection is fitted to the recess.

10. A method for installing an undersupporting device to a system for manufacturing an assembly board, the method comprising:
providing a system for manufacturing an assembly board, the system including
an undersupporting device comprising a hollow box with a top board,
a carrier configured to hold the undersupporting device
an undersupporting-device installer made of a magnetic material, the undersupporting-device installer being attachable to and detachable from the undersupporting device, and
a magnet provided on a lower surface of the undersupporting device,
positioning the undersupporting device at a working position by transporting the carrier to the working position while the carrier holds the undersupporting device;
fixing, to the undersupporting-device installer, the undersupporting device positioned at the working position by a magnetic force of the magnet; performing a processing step to an upper surface of the board while the undersupporting device is fixed to the undersupporting-device installer and the undersupporting device supports a lower surface of the board.

* * * * *